United States Patent
Schemmann et al.

(10) Patent No.: US 9,191,064 B2
(45) Date of Patent: Nov. 17, 2015

(54) PILOT TONE FOR AMPLIFIER BIAS POINT

(71) Applicant: ARRIS Enterprises, Inc., Suwanee, GA (US)

(72) Inventors: Marcel F. Schemmann, Maria Hoop (NL); Venkatesh G. Mutalik, Middletown, CT (US)

(73) Assignee: ARRIS Enterprises, Inc., Suwanee, GA (US)

( * ) Notice: Subject to any disclaimer, the term of this patent is extended or adjusted under 35 U.S.C. 154(b) by 0 days.

(21) Appl. No.: 14/463,017

(22) Filed: Aug. 19, 2014

(65) Prior Publication Data
US 2015/0049822 A1    Feb. 19, 2015

Related U.S. Application Data

(60) Provisional application No. 61/867,550, filed on Aug. 19, 2013.

(51) Int. Cl.
*H04B 3/10* (2006.01)
*H03F 1/02* (2006.01)
*H03F 1/32* (2006.01)
(Continued)

(52) U.S. Cl.
CPC ............... *H04B 3/10* (2013.01); *G02F 1/0123* (2013.01); *H03F 1/02* (2013.01); *H03F 1/0233* (2013.01); *H03F 1/3241* (2013.01); *H03F 3/189* (2013.01); *H03F 3/20* (2013.01); *H04B 7/15535* (2013.01); *H04B 10/25751* (2013.01); *H04L 25/06* (2013.01); *H04N 21/6118* (2013.01);
(Continued)

(58) Field of Classification Search
CPC ................... H04B 7/15535; H04B 2001/0416; H04B 3/10; H04B 10/25751; G02F 1/0123; H03F 1/20; H03F 1/02; H03F 3/189; H03F 1/0233; H03F 2200/102; H03F 2201/3212; H03F 2201/3215; H04N 21/6118; H04L 25/06
See application file for complete search history.

(56) References Cited

U.S. PATENT DOCUMENTS 5,589,967 A * 12/1996 Auffret ........................ 398/54
5,812,297 A *  9/1998 Mussino et al. ............ 398/198

(Continued)

FOREIGN PATENT DOCUMENTS

| EP | 0768765 A1 | 4/1997 |
| EP | 1005182 A1 | 5/2000 |
| EP | 2495607 A2 | 9/2012 |

OTHER PUBLICATIONS

PCT Search Report & Written Opinion, RE: Application No. PCT/US2014/051663, dated Jan. 8, 2015.
D. Davidson, et al., "Quasi-feed-forward linearization of electro-optic modulators for analog signal transmission", Optical Engineering, Apr. 1, 1993, pp. 730-734.

*Primary Examiner* — Sophia Vlahos
(74) *Attorney, Agent, or Firm* — Lori Anne D. Swanson

(57) ABSTRACT

Methods and systems for using a signal to generate a pilot tone to modulate the bias point of an amplifier that amplifies the signal. In a cable television (CATV) network, a processor receives a signal to be amplified by an amplifier at a location remote from the processor. A bias point of the amplifier may be modulated to reduce amplifier dissipation. The processor analyzes the received signal to determine a pilot tone for modulating the bias point of the amplifier. The pilot tone may be transmitted to the remote amplifier in the signal. For example, a pilot tone may be generated in a CATV head end, transmitted along a signal path, and downstream amplifiers can use the pilot tone to modulate the bias point of the amplifier as the signal is being amplified.

26 Claims, 20 Drawing Sheets

(51) Int. Cl.
- *H04L 25/06* (2006.01)
- *H04B 7/155* (2006.01)
- *H03F 3/189* (2006.01)
- *H03F 3/20* (2006.01)
- *H04B 10/2575* (2013.01)
- *H04N 21/61* (2011.01)
- *G02F 1/01* (2006.01)

(52) U.S. Cl.
CPC ... *H03F2200/102* (2013.01); *H03F 2201/3212* (2013.01); *H03F 2201/3215* (2013.01)

(56) References Cited

U.S. PATENT DOCUMENTS

| | | | |
|---|---|---|---|
| 6,055,093 A * | 4/2000 | Chikuma et al. | 359/337 |
| 7,369,290 B1 | 5/2008 | Cox et al. | |
| 2002/0153956 A1 | 10/2002 | Wojslaw | |
| 2003/0146791 A1 | 8/2003 | Shvarts et al. | |
| 2004/0218931 A1 | 11/2004 | Frederiksen et al. | |
| 2007/0281652 A1 | 12/2007 | Tanaka et al. | |
| 2013/0191877 A1 | 7/2013 | Rakib | |

* cited by examiner

OVERALL HFC SYSTEM BLOCK DIAGRAM

PILOT TONE FOR AMPLIFIER BIAS POINT

CROSS-REFERENCES TO RELATED APPLICATIONS

The present disclosure claims priority to U.S. Provisional Application No. 61/867,550 entitled "Fiber-Optic Node with Forward Data Content Driven Power Consumption", filed Aug. 19, 2013, the contents of which is incorporated herein by reference in its entirety.

BACKGROUND

A cable television (CATV) system is capable of providing a variety of media content, such as video, data, voice, or high-speed Internet services to subscribers. The CATV provider typically delivers the media content from a head end to its subscriber's client devices over a transmission network such as a coaxial network, a fiber optic network, or a hybrid fiber/coax (HFC) network. Requirements for data throughput (or bandwidth) in these CATV networks are growing exponentially as customers demand more content, data services, etc. Though improvements in encoding efficiencies and transport protocols have thus far allowed cable operators to keep pace with subscriber and competitive demands, it is important to continue the analysis of the various network elements that can enhance or inhibit the overall performance of next-generation cable networks.

Most of the radio frequency (RF) amplifiers within the cable television network operate in what is referred to as a "class A" mode of operation, which provides a very high fidelity signal, often quantified in terms of signal-to-noise and signal-to-2nd, 3rd, 4th, 5th . . . harmonic distortion products. However, the power consumption for the class A mode of operation is on the order of 100 times higher than the composite power of an RF output signal. This higher power consumption results from the need to accommodate significant and frequent 'peak to average' deviations from the effective signal power, which may include setting the output RF rms amplitude of the amplifier at no more than roughly 25% of the output rail-to-rail range of either voltage or current, depending on the implementation. The higher demand for power consumption drives up the cost of cable network products that require RF gain blocs (e.g., head end optical transmitters and receivers, fiber-optic nodes, RF distribution amplifiers). Thus, it is desirable to reduce the power dissipation in a CATV network without compromising output signal power in relation to noise. It would be even more desirable to reduce the power dissipation in a CATV network while improving output signal power in relation to noise.

BRIEF DESCRIPTION OF THE DRAWINGS

For the purpose of illustrating embodiments described below, there are shown in the drawings example constructions of the embodiments; however, the embodiments are not limited to the specific methods and instrumentalities disclosed. In the drawings.

Figure 1:
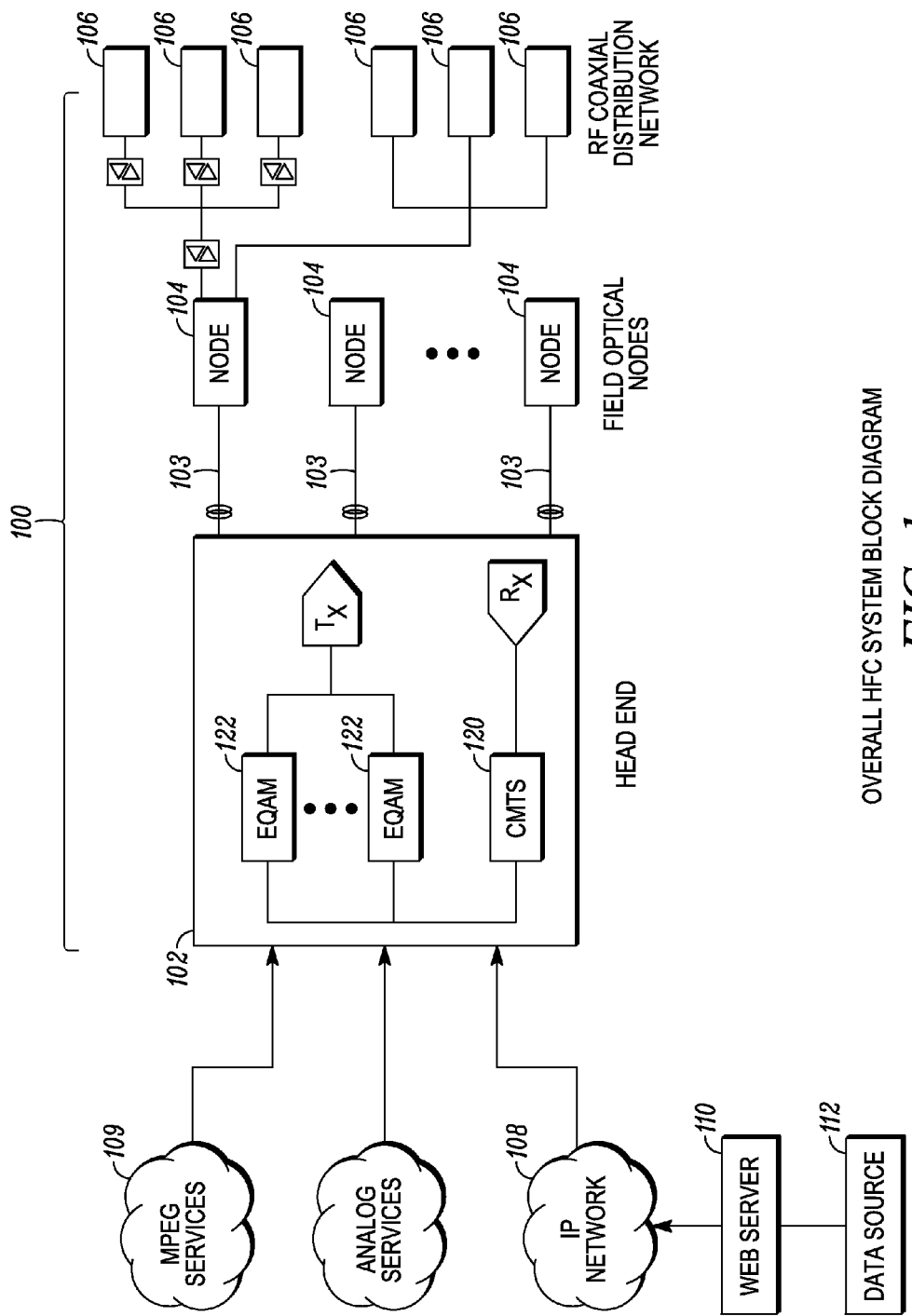
FIG. 1 illustrates an example CATV system.

It should be understood that, while the accompanying figures illustrate embodiments that include the portions of the disclosure claimed, and explain various principles and advantages of those embodiments, the details displayed are not necessary to understand the illustrated embodiments, as the details depicted in the figures would be readily apparent to those of ordinary skill in the art having the benefit of the present disclosure.

DETAILED DESCRIPTION

The present disclosure describes systems and methods that reduce power consumption in a CATV network, including (1) systems that improve the power efficiency of a node in a CATV network by drawing power based on a signal; and (2) methods that use signal envelope information to reduce power consumption in a CATV transmission system. As described in more detail later in this specification, disclosed systems and methods utilize and expand on many digital forward path concepts, including but not limited to: 1) analog to digital (A2D) RF signal conversion at one end of a communication link (e.g., at the head end transmitter side for digital forward path transmission); 2) oversampling, i.e. sampling at a rate larger than the Nyquist frequency of twice the sampled bandwidth so as to enable implementation of sharp digital filtering, which reduces the number of binary data bits required for RF signal reassembly; 3) compression coding, e.g., Huffman-type encoding, to further reduce the number of binary bits required for RF signal reassembly; 4) optical on/off transmission over required distances, but less than 100 miles which is limit specified by the Data Over Cable Service Interface Specification (DOCSIS®) standard; and 5) data decompression at a receiver followed by digital to analog (D2A) signal conversion in order to reassemble an originally encoded RF signal from a transmitter.

Also, the present disclosure describes systems and methods that introduce a delay to be implemented after received data from a signal is decompressed but prior to the decompressed signal data being amplified by a gain block. During the delay, the decompressed data is used to predict the magnitude of the signal envelope that is going to be amplified by the gain block at an incrementally later time. The magnitude of the signal envelope is then used to generate an auxiliary signal that drives the power supply to the RF gain block in a manner that minimizes the required voltage/current for the gain block, and thus minimizes the power consumed by the block. Moreover, a delayed auxiliary signal based on the predicted magnitude of the signal envelope in combination with the, optionally delayed, signal itself can be used as a feed-forward pre-distortion signal that corrects for distortion introduced by the RF gain block when amplifying the signal envelope.

The systems and methods disclosed in the present application can be particularly useful for reducing the power consumption of a fiber optical node that has a large number of RF outputs, and acts as the last amplifier before servicing customer premises—in architectures alternatively referred to as "fiber to the last active" (FTTLA), Node plus zero (N+0), or fiber deep architectures—because in such nodes the RF signals at the output of the node typically consume a relatively large amount of power. It should be understood, however, that other architectures or components of other architectures may benefit from the disclosed techniques, such as upstream or return path A2D/D2A systems, or digital return receivers. Further, the disclosed techniques could be applied to regulating RF gain stages of other digital forward receivers, even if the receiver is not the last RF gain stage in the downstream architecture. Additional details for various embodiments are described in more detail below.

FIG. 1 shows an exemplary cable television (CATV) system 100 operable to deliver high-definition digital entertainment and telecommunications such as video, voice, and high-speed Internet services. Generally speaking, the CATV system 100 refers to the operational (e.g., geographical) footprint of an entertainment and/or information services franchise that provides entertainment and/or information services to a subscriber base spanning one or more towns, a region, or a portion thereof. Particular entertainment and/or information services offered by the franchise (e.g., entertainment channel lineup, data packages, etc.) may differ from system to system. Some large cable companies operate several cable communication systems (e.g., in some cases up to hundreds of systems), and are known generally as Multiple System Operators (MSOs).

The cable network can take the form of an all-coax, all-fiber, or hybrid fiber/coax (HFC) network, e.g., fiber to the last amplifier (FTTA). For purposes of illustration only, FIG. 1 depicts a hybrid fiber-coaxial (HFC) network. An HFC network is a broadband network that combines optical fiber and coaxial cable, strategically placing fiber nodes to provide services to a plurality of homes. It should be understood that the systems and methods disclosed in the present application may be employed in various networks and the HFC network is merely shown as a non-limiting example.

The network shown in FIG. 1 is an HFC broadband network that combines the use of optical fiber and coaxial connections. The network includes a head end 102 that receives analog video signals and digital bit streams representing different services (e.g., video, voice, and Internet) from various digital information sources. For example, the head end 102 may receive content from one or more video on demand (VOD) servers, IPTV broadcast video servers, Internet video sources, or other suitable sources for providing IP content.

An IP network 108 may include a web server 110 and a data source 112. The web server 110 is a streaming server that uses the IP protocol to deliver video-on-demand, audio-on-demand, and pay-per view streams to the IP network 108. The IP data source 112 may be connected to a regional area or backbone network (not shown) that transmits IP content. For example, the regional area network can be or include the Internet or an IP-based network, a computer network, a web-based network or other suitable wired or wireless network or network system.

At the head end 102, the various services are encoded, modulated and up-converted onto RF carriers, combined onto a single electrical signal and inserted into a broadband optical transmitter. A fiber optic network extends from the cable operator's master/regional head end 102 to a plurality of fiber optic nodes 104. The head end 102 may contain an optical transmitter or transceiver to provide optical communications through optical fibers 103. Regional head ends and/or neighborhood hub sites may also exist between the head end and one or more nodes. The fiber optic portion of the example HFC network 100 extends from the head end 102 to the regional head end/hub and/or to a plurality of nodes 104. The optical transmitter converts the electrical signal to a downstream optically modulated signal that is sent to the nodes. In turn, the optical nodes convert inbound signals to RF energy and return RF signals to optical signals along a return path. In the specification, the drawings, and the claims, the terms "forward path" and "downstream" may be interchangeably used to refer to a path from a head end to a node, a node to a subscriber, or a head end to a subscriber. Conversely, the terms "return path", "reverse path" and "upstream" may be interchangeably used to refer to a path from a subscriber to a node, a node to a head end, or a subscriber to a head end. Also, in the specification, in the drawings, and the claims a node may be any digital hub between a head end and a customer home that transports local requests over the CATV network. Forward path optical communications over the optical fiber may be converted at the nodes to Radio Frequency (RF) communications for transmission over the coaxial cable to the subscribers. Conversely, return path RF communications from the subscribers are provided over coaxial cables and are typically converted at a node to optical signals for transmission over the optical fiber to the head end. Each node 104 may contain a return path transmitter that is able to relay communications upstream from a subscriber device 106 to the head end 102.

Each node 104 serves a service group comprising one or more customer locations. By way of example, a single node 104 may be connected to thousands of cable modems or other subscriber devices 106. In an example, a fiber node may serve between one and two thousand or more customer locations. In an HFC network, the fiber optic node 104 may be connected to a plurality of subscriber devices 106 via coaxial cable cascade 111, though those of ordinary skill in the art will appreciate that the coaxial cascade may comprise a combination of RF amplifiers, taps & splitters and coaxial cable. In some implementations, each node 104 may include a broadband optical receiver to convert the downstream optically modulated signal received from the head end or a hub to an electrical signal provided to the subscribers' devices 106 through the coaxial cascade 111. Signals may pass from the node 104 to the subscriber devices 106 via the RF cascade 111, which may be comprised of multiple amplifiers and active or passive devices including cabling, taps, splitters, and in-line equalizers. It should be understood that the amplifiers in the RF cascade 111 may be bidirectional, and may be cascaded such that an amplifier may not only feed an amplifier further along in the cascade but may also feed a large number of subscribers. The tap is the customer's drop interface to the coaxial system. Taps are designed in various values to allow amplitude consistency along the distribution system.

The subscriber devices 106 may reside at a customer location, such as a home of a cable subscriber, and are connected to the cable modem termination system (CMTS) 120 or comparable component located in a head end. A client device 106 may be a modem, e.g., cable modem, MTA (media terminal adaptor), set top box, terminal device, television equipped with set top box, Data Over Cable Service Interface Specification (DOCSIS) terminal device, customer premises equipment (CPE), router, or similar electronic client, end, or terminal devices of subscribers. For example, cable modems and IP set top boxes may support data connection to the Internet and other computer networks via the cable network, and the cable network provides bi-directional communication systems in which data can be sent downstream from the head end to a subscriber and upstream from a subscriber to the head end.

The techniques disclosed herein may be applied to systems compliant with DOCSIS. The cable industry developed the international Data Over Cable System Interface Specification (DOCSIS®) standard or protocol to enable the delivery of IP data packets over cable systems. In general, DOCSIS defines the communications and operations support interface requirements for a data over cable system. For example, DOCIS defines the interface requirements for cable modems involved in high-speed data distribution over cable television system networks. However, it should be understood that the techniques disclosed herein may apply to any system for digital services transmission, such as digital video or Ethernet PON over Coax (EPoc). Examples herein referring to DOCSIS are illustrative and representative of the application of the techniques to a broad range of services carried over coax.

References are made in the present disclosure to a Cable Modem Termination System (CMTS) in the head end 102. In general, the CMTS is a component located at the head end or hub site of the network that exchanges signals between the head end and client devices within the cable network infrastructure. In an example DOCSIS arrangement, for example, the CMTS and the cable modem may be the endpoints of the DOCSIS protocol, with the hybrid fiber coax (HFC) cable plant transmitting information between these endpoints. It will be appreciated that architecture 100 includes one CMTS for illustrative purposes only, as it is in fact customary that multiple CMTSs and their Cable Modems are managed through the management network.

The CMTS 120 hosts downstream and upstream ports and contains numerous receivers, each receiver handling communications between hundreds of end user network elements connected to the broadband network. For example, each CMTS 120 may be connected to several modems of many subscribers, e.g., a single CMTS may be connected to hundreds of modems that vary widely in communication characteristics. In many instances several nodes, such as fiber optic nodes 104, may serve a particular area of a town or city. DOCSIS enables IP packets to pass between devices on either side of the link between the CMTS and the cable modem.

It should be understood that the CMTS is a non-limiting example of a component in the cable network that may be used to exchange signals between the head end and subscriber devices 106 within the cable network infrastructure. For example, other non-limiting examples include a Modular CMTS (M-CMTS™) architecture or a Converged Cable Access Platform (CCAP).

An EdgeQAM (EQAM) 122 or EQAM modulator may be in the head end or hub device for receiving packets of digital content, such as video or data, re-packetizing the digital content into an MPEG transport stream, and digitally modulating the digital transport stream onto a downstream RF carrier using Quadrature Amplitude Modulation (QAM). EdgeQAMs may be used for both digital broadcast, and DOCSIS downstream transmission. In CMTS or M-CMTS implementations, data and video QAMs may be implemented on separately managed and controlled platforms. In CCAP implementations, the CMTS and edge QAM functionality may be combined in one hardware solution, thereby combining data and video delivery.

Orthogonal frequency-division multiplexing (OFDM) may utilize smaller sub bands (compared to QAM carriers). For example, while a conventional DOCSIS QAM carrier is 6 MHz wide, the CATV system may employ orthogonal frequency division multiplexing (OFDM) technology with OFDM carriers that are approximately 25 kHz to 50 kHz wide. Thus, where previously 100 QAM carriers were used, thousands of OFDM subcarriers may be used. OFDM technology may be suitable for noisy signal conditions and may enable use of more of the available spectrum without reducing the quality of server. In example implementations, a cable network may use the QAM modulation for downstream speeds and boost upstream speeds using OFDM.

Figure 2:
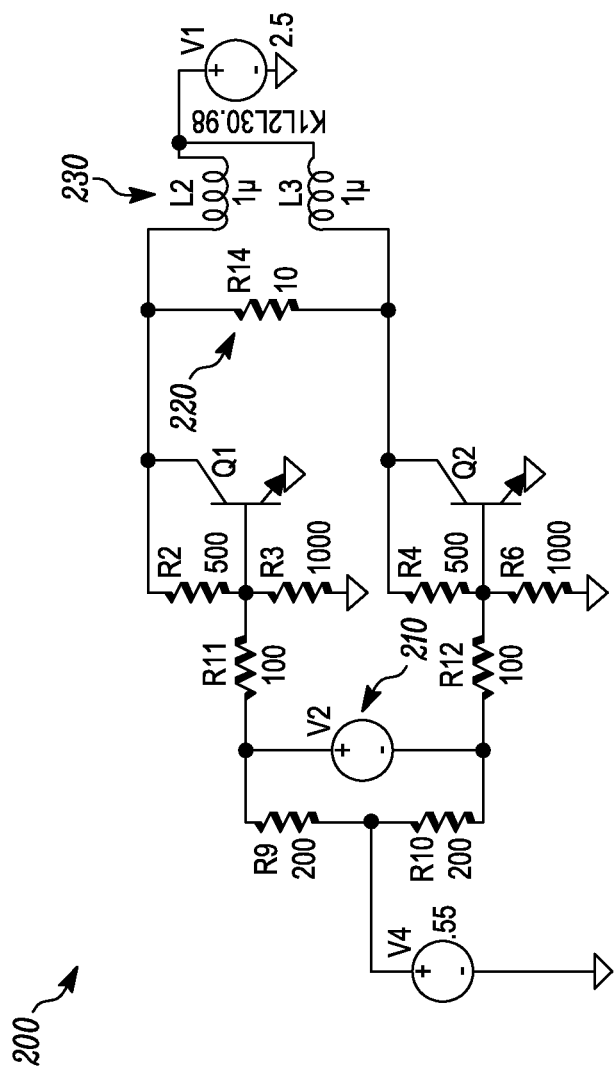
FIG. 2 illustrates a schematic diagram of a representative basic push-pull transistor amplifier.

FIG. 2 shows a representative schematic of a basic push-pull transistor amplifier 200 that amplifies an input signal 210 driven by a differential voltage from supply V2 to produce an output signal 220 through resistor R14. The amplifier 100 draws current supplied to two transistors Q1 and Q2 to provide the desired amplified signal voltage across the resistor R12. Resistors R11 and R12 set an input impedance to the amplifier of around 200 Ohms. Power supply V4 provides a common voltage to the inputs that is used to set a current bias point of the amplifier. Each transistor has a feedback resistor R2 and R4, respectively to the collectors of the transistors, which are connected to the low impedance differential load R10 that is provided the output voltage signal 220 across it. Transformer 230 connected to voltage source V1 is also used to bias the amplifier by providing a high impedance to differential signals and a low impedance to common mode current.

Figure 3:
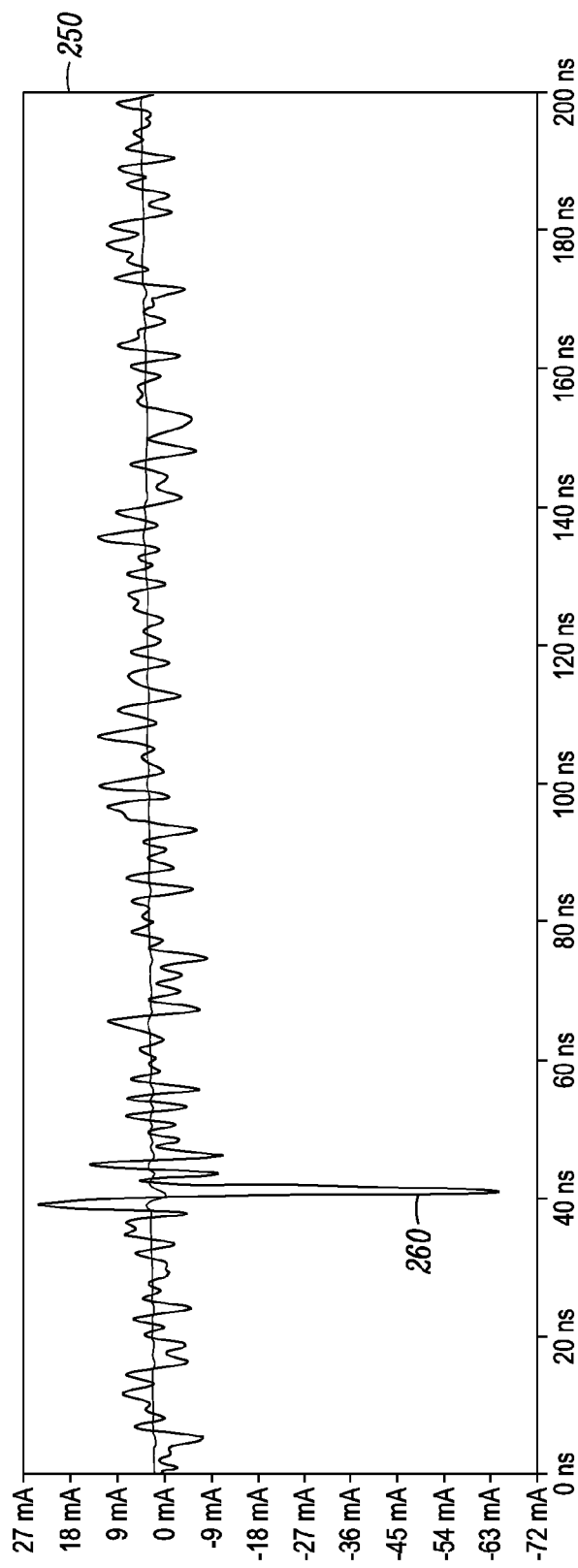
FIG. 3 illustrates the output current that results from an exemplary input current to the amplifier shown in FIG. 2.

FIG. 3 shows the input current 250 through resistor R11 and the output current 260 through the resistor R14 of the amplifier circuit 200, for a multi-channel modulated RF signal typical for CATV nodes. The current gain is large (>20×). The output amplitude is usually close to an average rms value but occasionally high amplified signal peaks occur. The peak values are typically on the order of 6 times the rms value with a relatively low probability (in time) on the order of $10^{-6}$. However, since amplifier clipping leads to bit errors in RF communication links, the amplifiers must amplify these peaks with high fidelity even though the occurrence rate is relatively low.

Figure 4:
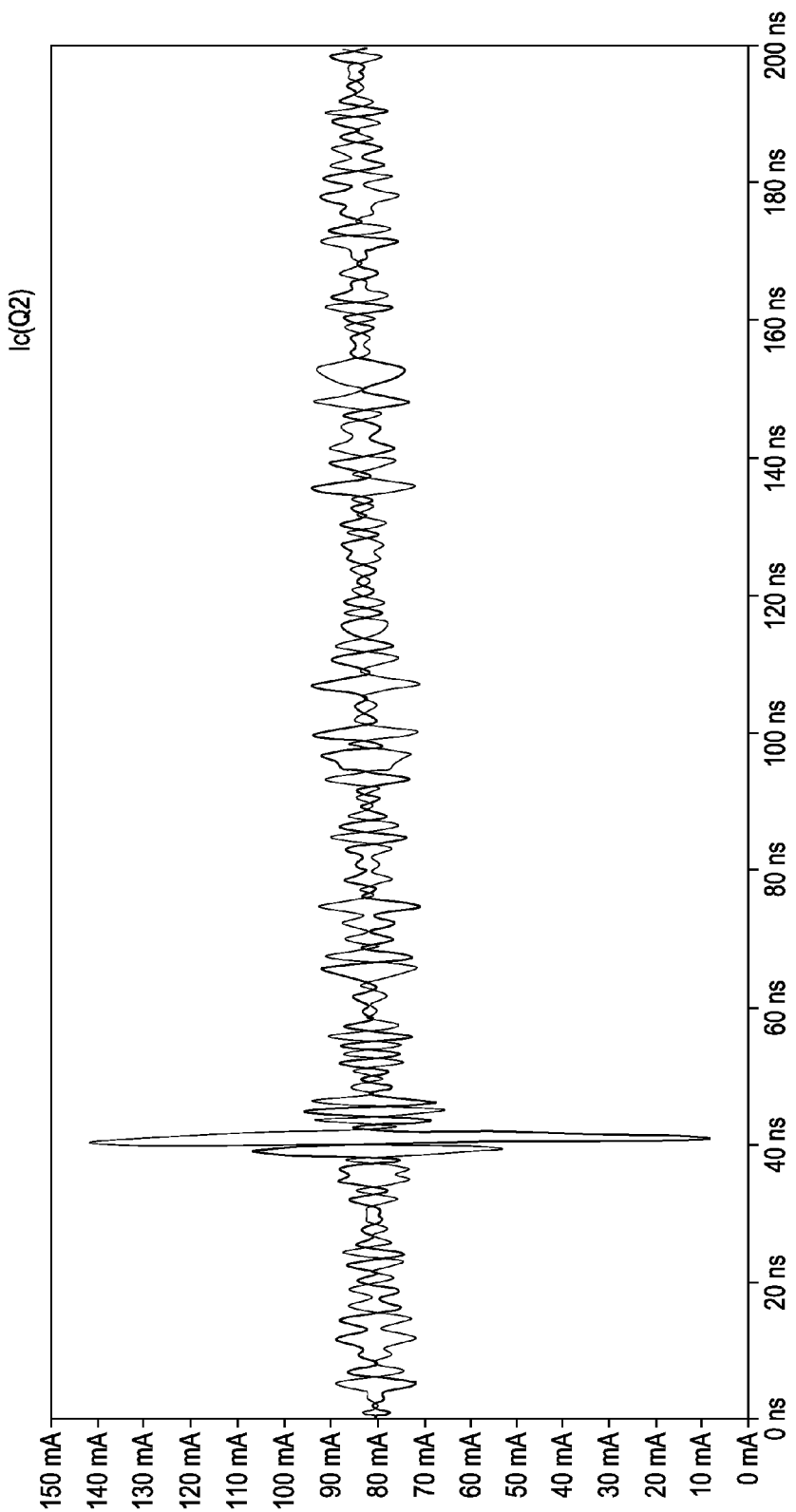
FIG. 4 illustrates the transistor current provided by the amplifier for FIG. 2 in a biased state when providing the amplified signal of FIG. 3.

In order to provide the required current gain to amplify a signal with the large signal peaks shown in FIG. 3, the amplifier must usually be biased at a high current. Thus can be most easily seen in FIG. 4, which shows the amplifier current used by the transistor Q2 in the amplifier 200 of FIG. 2 where the amplifier is biased at approximately 80 mA. When amplifying the signal 250 shown in FIG. 3, during the peak in output voltage the current in the transistor Q2 falls to just under 10 mA. At 0 mA the amplifier would have been unable to further amplify the signal and clipping distortion would have occurred. Stated differently, were the amplifier circuit 200 not biased to 80 mA but biased at a lower point, or alternatively, if the input to the amplifier had a higher signal peak to be amplified, clipping would have occurred along with the attendant signal degradation (bit error) that accompanies distortion from amplifier clipping.

RF amplifiers in an HFC network typically operate in a "Class A" mode of operation, meaning that they provide a high fidelity amplified signal where the bit error rate should be no more than approximately $10^{-8}$. As just noted, given that the signal peaks occur at a rate of $10^{-6}$, i.e. 100 times the frequency of the required bit error rate, the RF amplifiers in an HFC network must provide a sufficiently high bias point that only approximately one in a hundred or less of the amplified signal peaks are clipped. Because the signal peaks occur so infrequently, however, and because the signal peaks are approximately six times higher than the rms value of the signal, biasing the amplifier to account for the signal peaks makes the amplifier circuit highly inefficient. In a typical case, for example, to provide 100 mW of total RF output of the amplified signal, about 10 W of power is required, i.e. only about 1% of the power supply to the amplifier is used to provide the RF energy output while the remainder of the power is consumed to bias the amplifier at a current that is almost always much higher than necessary to amplify the signal, except for the infrequent signal peaks.

There are more than four million amplifiers dispersed throughout HFC networks in the United States alone. This translates into a total energy consumption in the millions of dollars per year, which as just noted is mostly energy that is only needed to amplify highly sporadic signal peaks.

Figure 5:
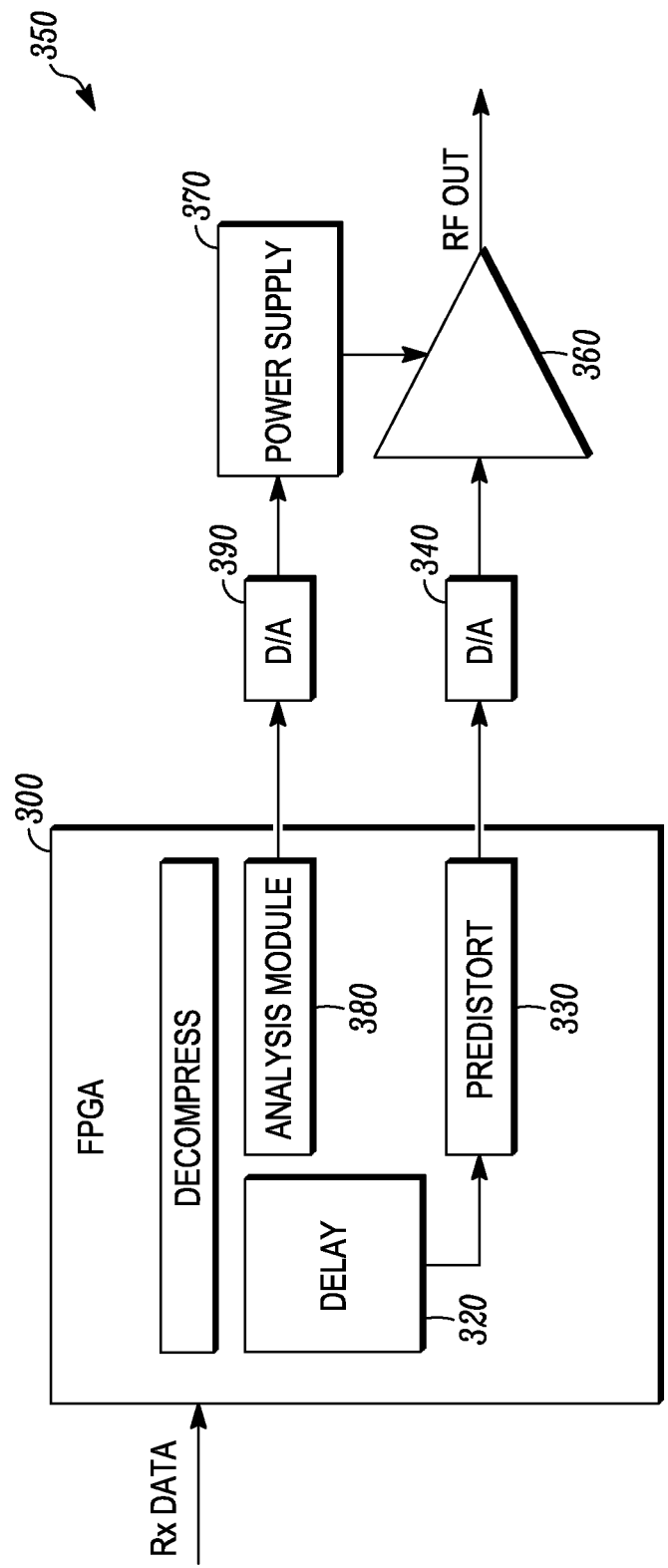
FIG. 5 illustrates an embodiment of the disclosed digital forward receiver.

FIG. 5 shows an exemplary receiver 300 capable of being used in a node 104 to modulate an amplifier power supply so as to efficiently attain amplified RF output power with much lower power dissipation than existing amplifiers. The receiver 300 may preferably include a decompression module 310 that receives radio frequency data and decompresses it, but could also include other means to generate a digital waveform. Prior to amplifying the decompressed data, the receiver 300 introduces a delay 320 before processing the signal by an optional pre-distortion module 330 and inputting the signal to a D2A converter 340 that drives the input signal to an amplifier 350 having a gain block 360 and power supply 370.

During the delay 320, the receiver 300 preferably includes an analysis module 380 that analyzes the decompressed radio frequency data, i.e. the same data that comprises the input signal to the amplifier 350, and uses the data to create a modulation signal to the power supply 370 through D2A converter 390. The modulation signal can comprise any one of a number of alternate forms. For example, in a simple embodiment, the power supply 370 may be modulated in a binary manner between a normal (low) bias point used during the periods when the signal is not experiencing signal peaks and a peak (high) bias point when the signal is experiencing signal peaks. Because of the delay 320, the bias point of the amplifier 350 may be modulated in a synchronous manner with the signal that it amplifies so that the bias point is raised as the signal experiences a peak and is lowered as the signal falls from the peak. In other embodiments, more complicated modulation schemes may be employed, such as switching the bias between more than two bias points to account for variances in the amplitudes among signal peaks, or even modulating the bias voltage or current of the amplifier in a manner that is linear with respect to the signal amplitude at any point in time. It should be understood that the delay 320 may be introduced at any time before amplifying the data so that the amplified data coincides with the modulation signal, and that the illustration of the delay occurring after decompression is illustrative only, particularly given that some systems may not include compressed data, or otherwise need to decompress data for amplification.

The receiver 300 may also optionally include many of the components that make up a digital return transmitter, with the addition of an A2D converter. The digital forward receiver can thereby perform the function of a digital return transmitter with bandwidths of 85, 2×85, 200 or 2×200 MHz using a bidirectional optical pluggable in the 4.25 Gbs or 11.3 Gbs port. Thus, the digital forward receiver can be converted to essentially most of the components of a node with forward and reverse traffic for a small added cost.

As can be appreciated by those of ordinary skill in the art, the receiver 300 can use signal processing to predict power envelopes and automatically compensate amplifier artifacts due to supply modulation by generating a compensation signal in the output D2A converter. The bias point of the amplifier (current and/or voltage) may be modulated to reduce amplifier dissipation. In some embodiments, the receiver 300 can dissipate on the order of 4 times less supply power for a given output power level. Less power used by the receiver 300 enables the use of smaller transistors, a smaller heat-sink, lower cost packaging, and a reduction of the node size and power consumption.

It should be noted that while embodiments disclosed herein describe a node amplifier solution for power reduction, the concepts apply for other amplifiers in the cable network. For example, embodiments may incorporate modulation of analog amplifiers cascaded in the field that may not be driven directly by D/A converters. In an amplifier in the cascade of amplifiers, lower cost amplifiers are desirable. As disclosed, embodiments for the cascaded amplifier may provide a lower cost amplifier via the reduction of the power dissipation with a higher output power capability as an option. Where the cable network has been upgraded, lower cost amplifiers that reduce power dissipation but allow higher output are desirable.

Embodiments disclosed for creating a more efficient amplifier are beneficial for existing networks and advanced or next generation networks. For example, even if an advanced architecture, e.g., the Node+0 architecture is not adopted, amplifiers that are more power efficient are still desirable. Given that amplifiers compensate for the losses in the leg preceding them, a universal setting from the node works on a collection of amplifiers. As most amplifiers have a similar tilt and gain setting and are operated with a similar power load, by and large the same setting will apply to a chain of amplifiers. Architectures will have shorter and shorter amplifier chains to settle on advanced architectures, e.g., N+1 or N+2.

The disclosed digital forward architecture permits very low cost and power efficient nodes. For example, embodiments for the disclosed digital forward techniques allow small cost and power efficient node designs that enable node replacement and also fiber deep architectures that are currently inhibited by node cost and by maximum wavelength counts on fiber. Furthermore, in embodiments where all processing is in the digital domain, there is flexibility in the band-split of such a design. Almost any RF gain stage can benefit from the disclosed techniques where a digitized input signal is made, delayed, and used as a decision input for a power supply and predistortion input. Existing standard HFC gain stages do not have a benefit of the digitized signal, thus the disclosed digital forward (and digital return) systems disclosed may benefit from the disclosed techniques for the receiving side of the system and the corresponding output RF gain stage (with a cost effective, minimal functional blocks/cost addition).

It should be noted that various implementations for the disclosed techniques are possible wherein the supply voltage and/or the transistor bias are modulated. The push and pull transistors may be independently driven by D2A converters to permit true class B operation or class B operation combined with supply modulation. Such manipulations can cause distortions in analog output signal; however the distortions are predictable. The digital pre-distorter 330 in the receiver 300 may optionally be used to mitigate the distortions.

Figure 6:
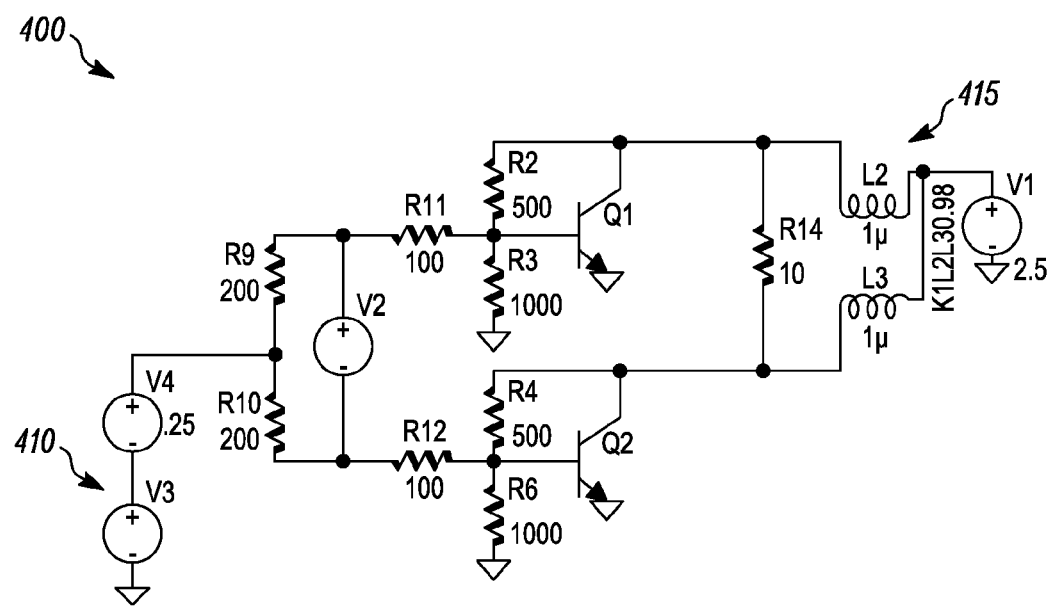
FIG. 6 illustrates an embodiment for modifying an amplifier biasing.
Figure 7:
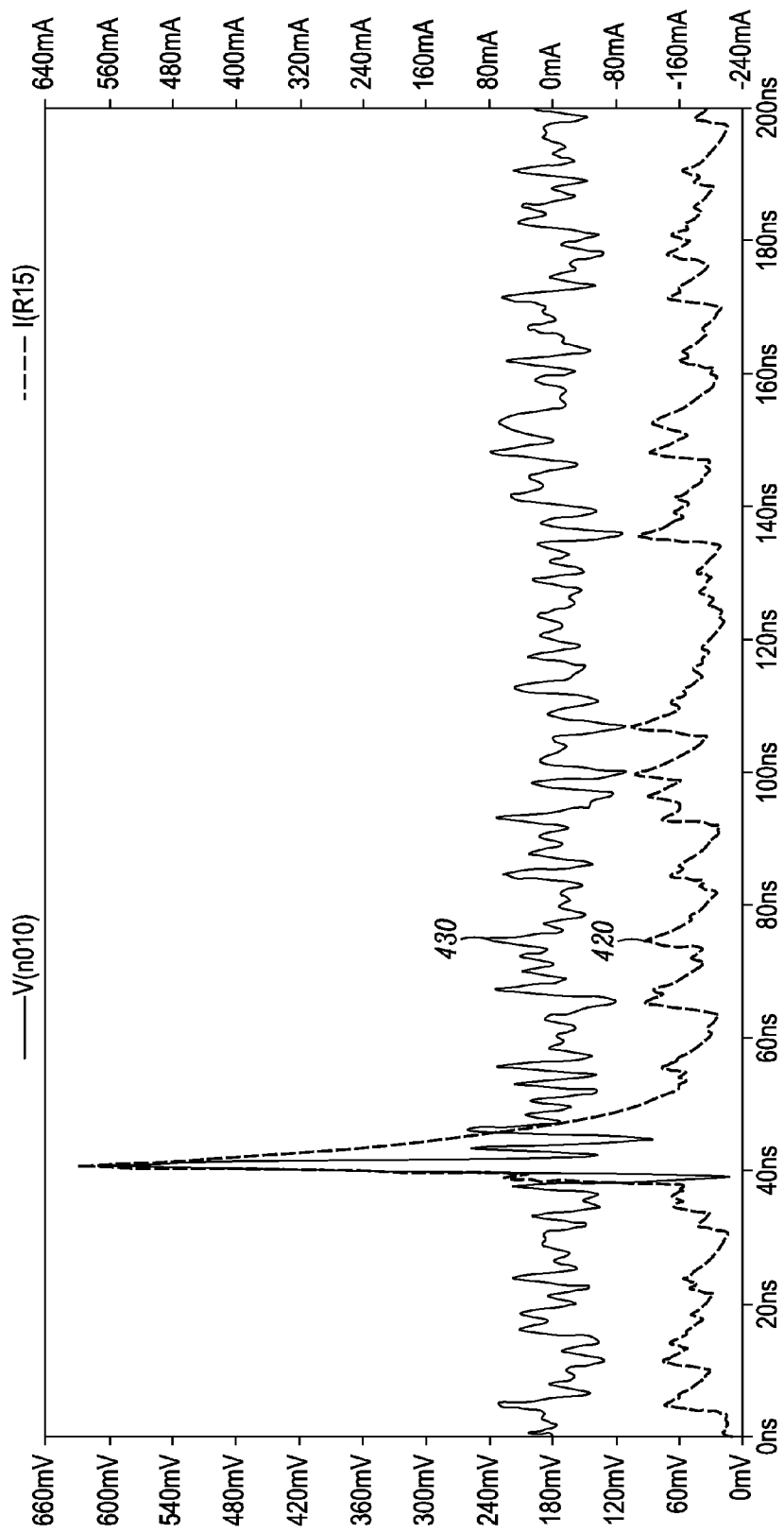
FIG. 7 illustrates the shape of a signal to amplify.

FIG. 6 depicts an exemplary push-pull amplifier 400 having a power supply 410 capable of being modulated using the receiver 300 such that the bias current is high only when a high peak needs to be amplified and low otherwise by adding a voltage source V3. The voltage source V3 is driven by a signal that is generated such that the bias is high when output peaks need to be amplified. FIG. 7 shows a waveform 420 representing the voltage provided from the voltage source V3 and a waveform 430 representing the shape of the signal to amplify. The bias signal is seen to increase when an output peak needs to be amplified. In the embodiment depicted in FIGS. 6 and 7, the bias signal was digitally generated by passing samples of the signal to amplify through a peak detection circuit and a subsequent filter, while the main signal (shown in red in FIG. 7) was delayed by a number of samples such that the response of the bias signal would coincide with the signal peak.

Figure 8:
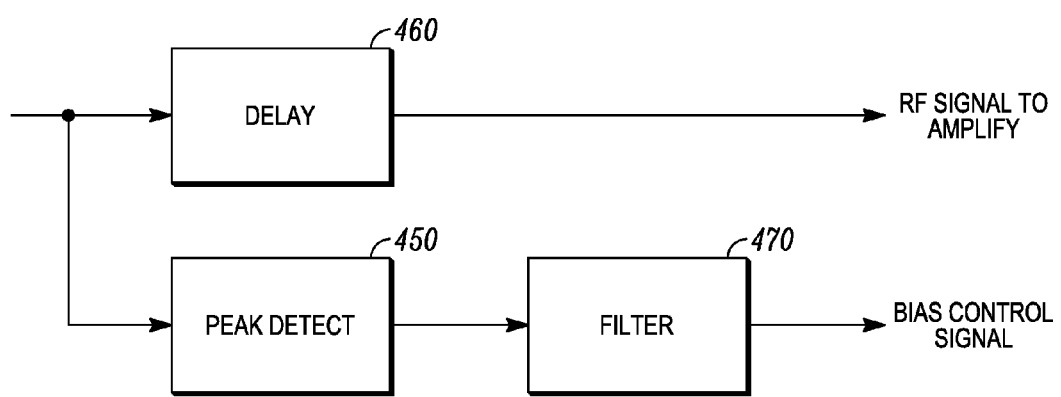
FIG. 8 illustrates an embodiment of a peak detect algorithm.

FIG. 8 illustrates an embodiment in which an analysis module 450 may detect both positive and negative peaks, and may calculate the absolute value of the RF signal to amplify before performing a peak detection or power detection operation. The amount of delay 460 is set such that the bias signal, after filtering by filter 470, can reach a peak value concurrently with a peak in the RF input signal to amplify. The RF signal can be output to a D2A converter to create an analog signal. The control bias signal can also be output to a D2A converter to create an analog bias signal.

Figure 9:
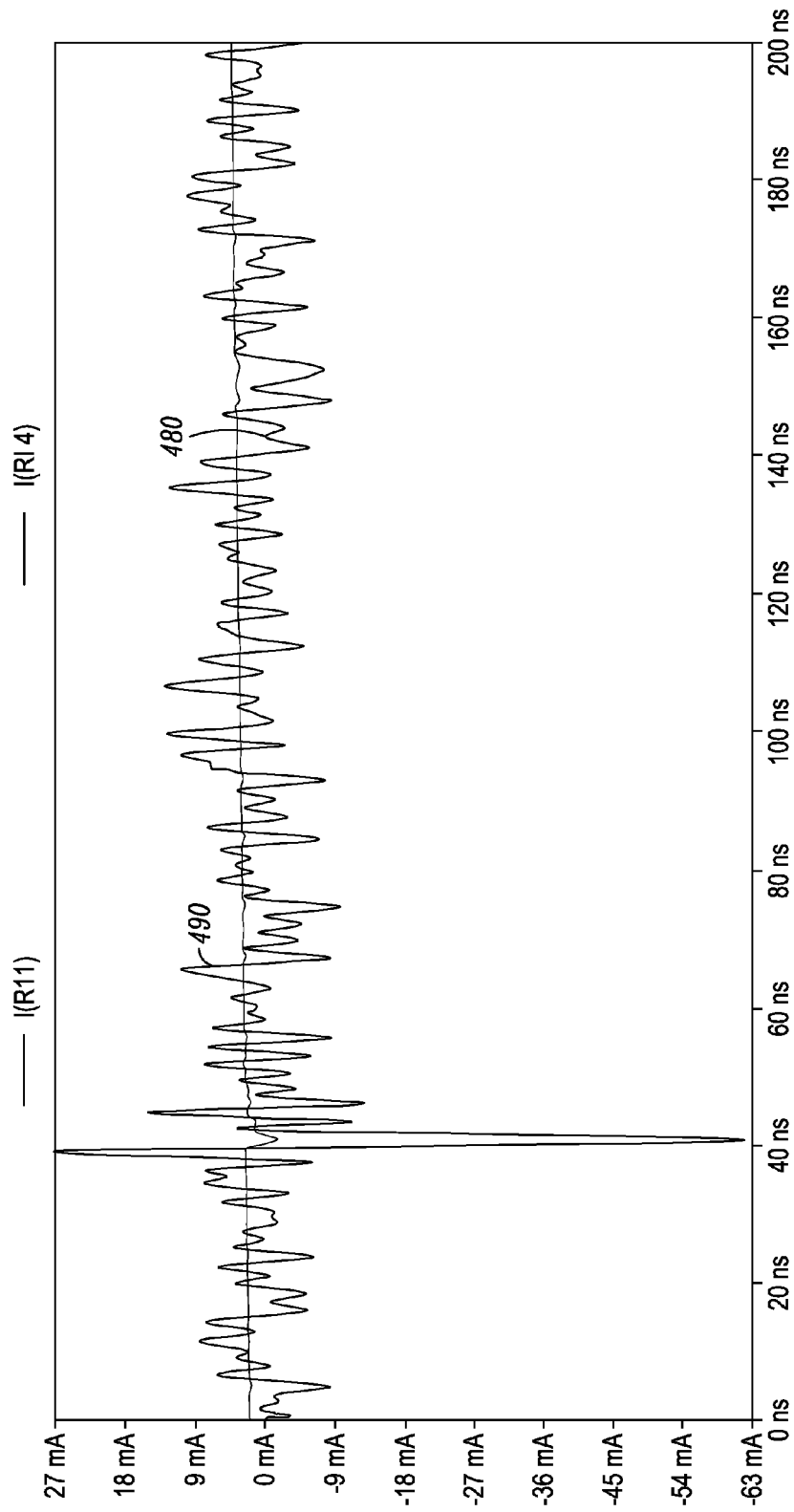
FIG. 9 illustrates the input and output waveforms that result from the embodiment shown in FIG. 8.
Figure 10:
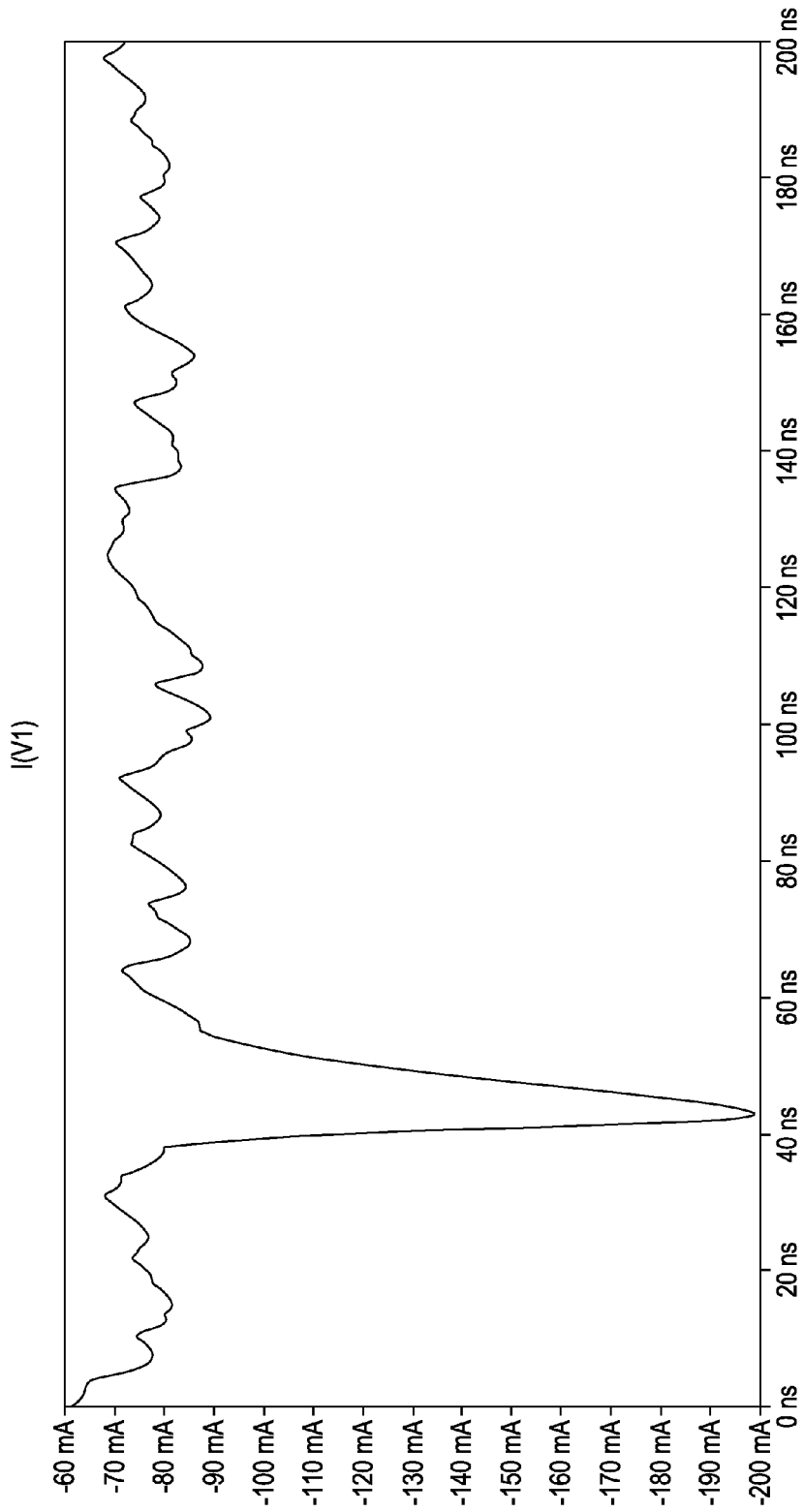
FIG. 10 illustrates an output signal peak when a bias current is high.
Figure 11:
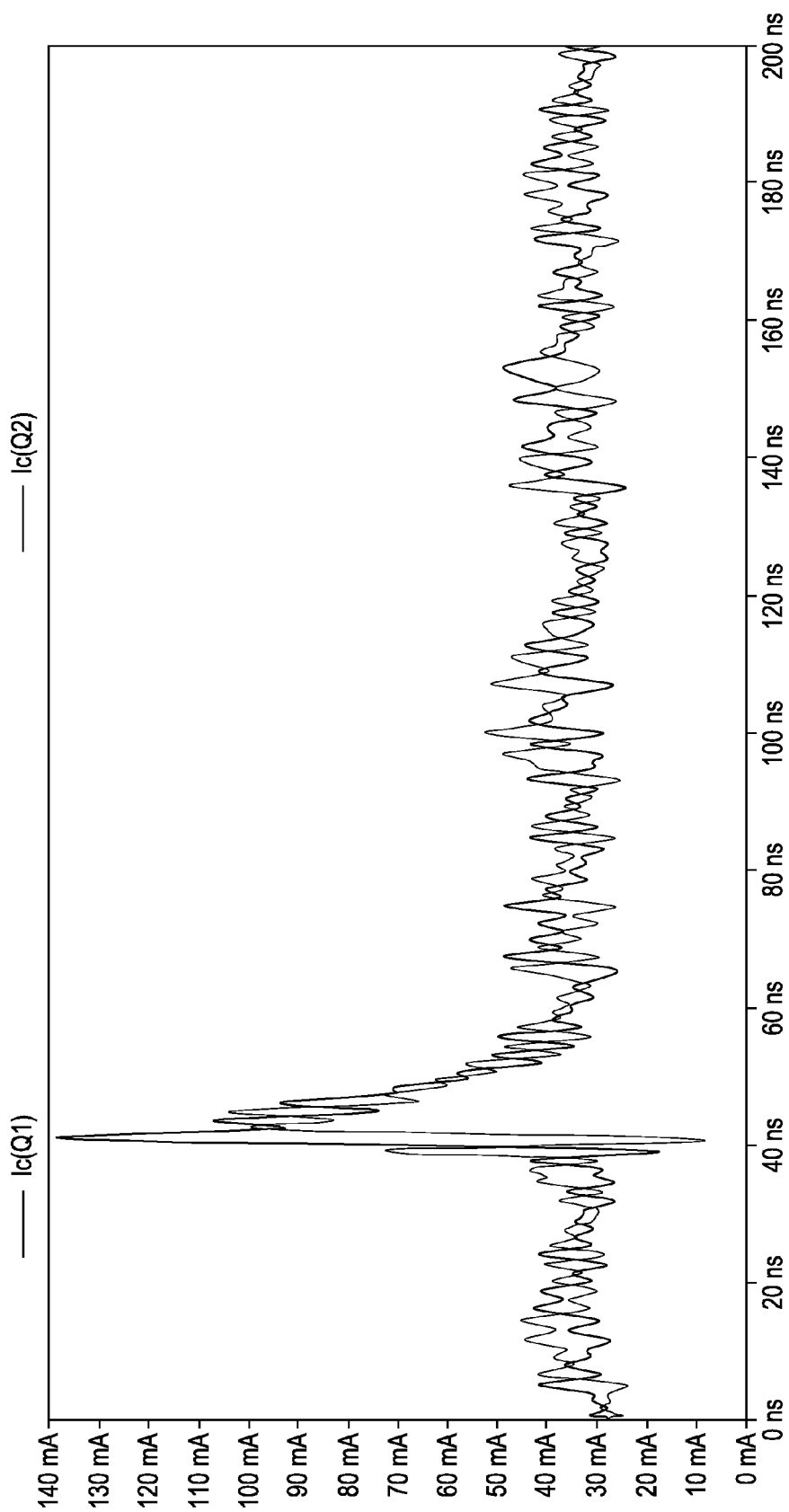
FIG. 11 illustrates exemplary transistor currents.

Resulting input waveform 480 and output waveform 490 from the embodiment of FIG. 8 are each shown in FIG. 9, which can be easily seen as a reproduction of the input and output waveforms of FIG. 3. FIG. 9 shows that the receiver's amplification of the input signal is unchanged. However, as can be seen in FIG. 10, the current from the power source V1 is no longer a constant current. The modulation of the bias point of the transistors results in a modulation of the power supply current from the transformer 415 of FIG. 6. FIG. 10 illustrates that when the output signal peak occurs the bias is actually high, peaking as high as 200 mA in this example. On average the bias current is much lower than in the previous example; 82 mA in this case. The power consumption of the amplifier has been reduced by a factor of approximately two (as seen in comparison to waveform 430 of FIG. 7). The transistor currents are shown in FIG. 11; as with the comparison for FIG. 11 and FIG. 7, the comparison of FIG. 11 to FIG. also shows an approximate reduction in power by a factor of two, where the lowest value is again just under 10 mA, but this is accomplished by a bias current of only approximately 40 mA per transistor instead of the original 80 mA.

Figure 12:
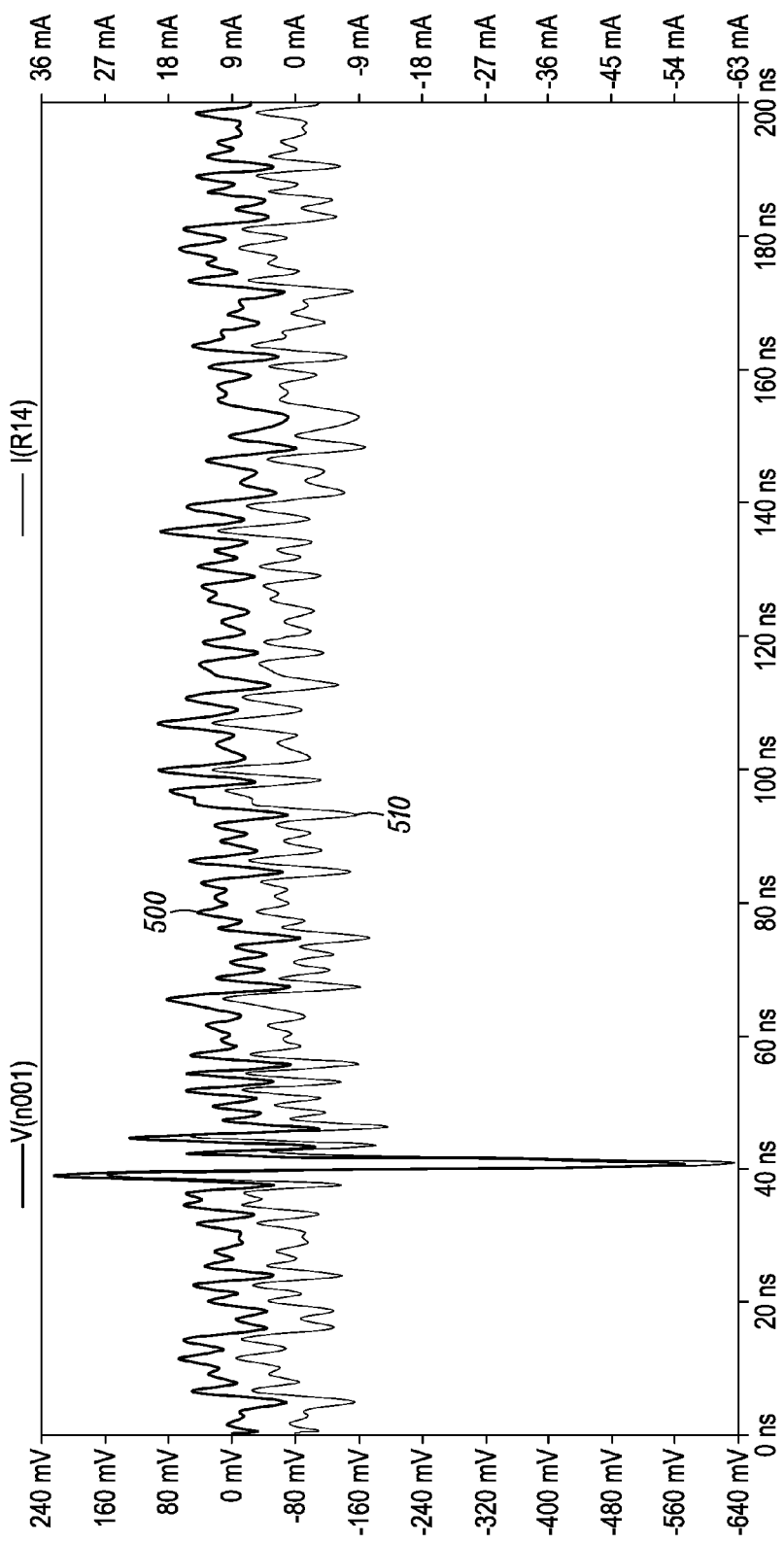
FIG. 12 illustrates an input signal and output signal scaled to approximately the same magnitude and compared.

Because the power supply via transformer 415 of FIG. 6 is insensitive to common mode current fluctuations (these are passed with little resistance) and because the differential output signal in R14 is also not sensitive to common mode fluctuations, the push-pull amplifier shown in FIG. 6 is particularly suitable for modulation of the bias current without affecting the signal to amplify because the bias control signal is self-cancelled in the output resistor R14. FIG. 12 illustrates an input signal 500 and output signal 510 that are scaled to approximately the same magnitude and compared; the input signal is amplified and reproduced with high fidelity.

Figure 13:
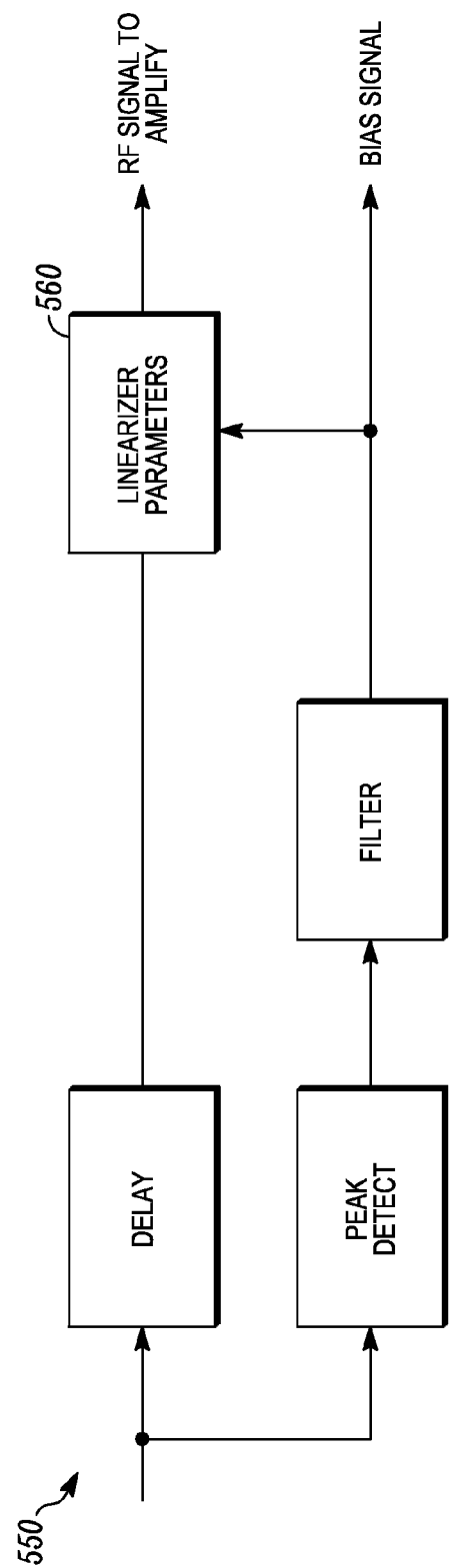
FIG. 13 illustrates an exemplary linearization function.

In CATV systems, however, extreme requirements can be applied to the fidelity of signal amplification. It is known that there is some dependence of the distortion behavior of amplifiers on the bias point. Accordingly, FIG. 13 shows an analysis module 550 that includes a linearizer 560 that applies a linearization function in the delayed signal path to drive the amplifier, where the parameters of the linearizer can optionally be controlled by the bias point of the amplifier. The implementation of the linearizer can be similar to linearizers used in laser optic transmitters (e.g., linearizer implementations that include digital signal implementations in FPGAs and discrete component implementations in RF components) such as U.S. Pat. Nos. 8,064,777, 8,547,174 and 8,145,066 as well as U.S. Patent Application Pub. No. 20030001670. The embodiment shown in FIG. 13 is suitable for systems where the signal is digitally processed such that all operations are in the digital domain. However, it should be understood that an implementation in the analog domain with RF components is also possible, including peak detection, delay, bias signal generation and/or linearization functionalities.

Figure 14:
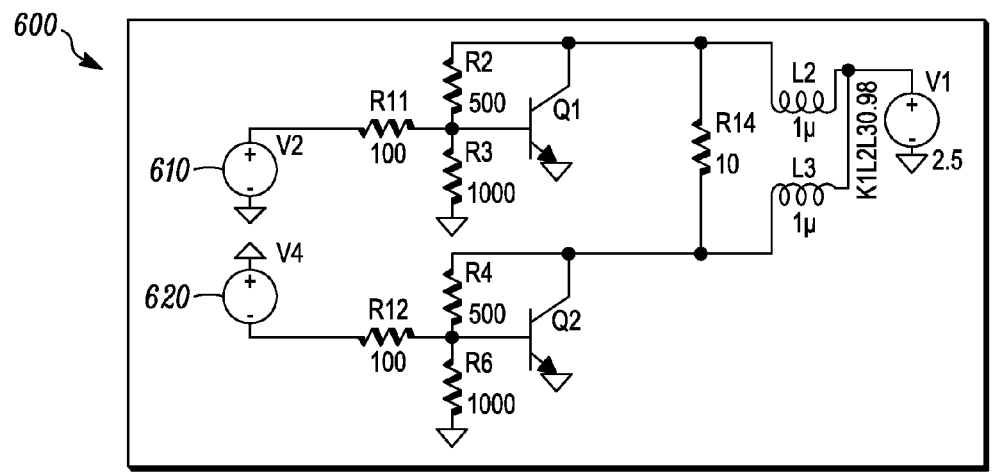
FIG. 14 illustrates an embodiment with two voltage sources driving a transistor amplifier.

It should also be understood that in some embodiments, the bias control signal and the RF signal to amplify need not be generated separately on D2A converters. For example, FIG. 14 depicts a push-pull amplifier 600 having two voltage sources 610 and 620 driving the differential transistor amplifier, each voltage source providing both bias control and RF signal information to the transistors. The overall signal amplified by the transistors can be the same as in the example depicted in FIGS. 9-11. Moreover, while the amplifier bias current can be controlled and modulated to reduce power dissipation, the amplifier bias voltage can also be controlled and modulated to reduce power dissipation or a combination thereof.

Figure 15:
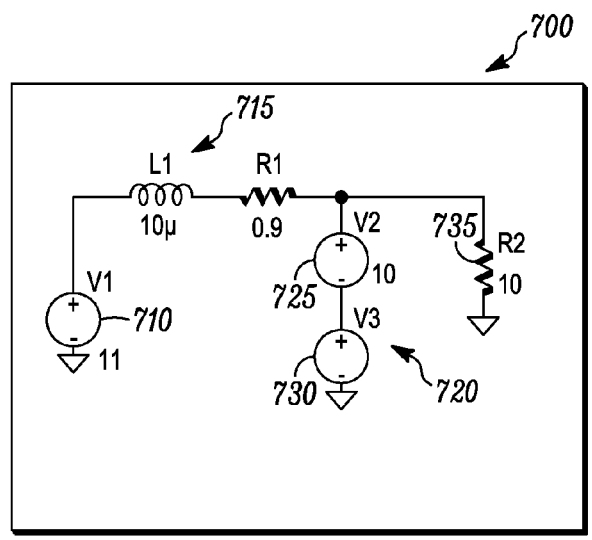
FIG. 15 illustrates a power supply having energy stored in an inductor that supports power delivery during normal operation and during voltage transients.
Figure 16:
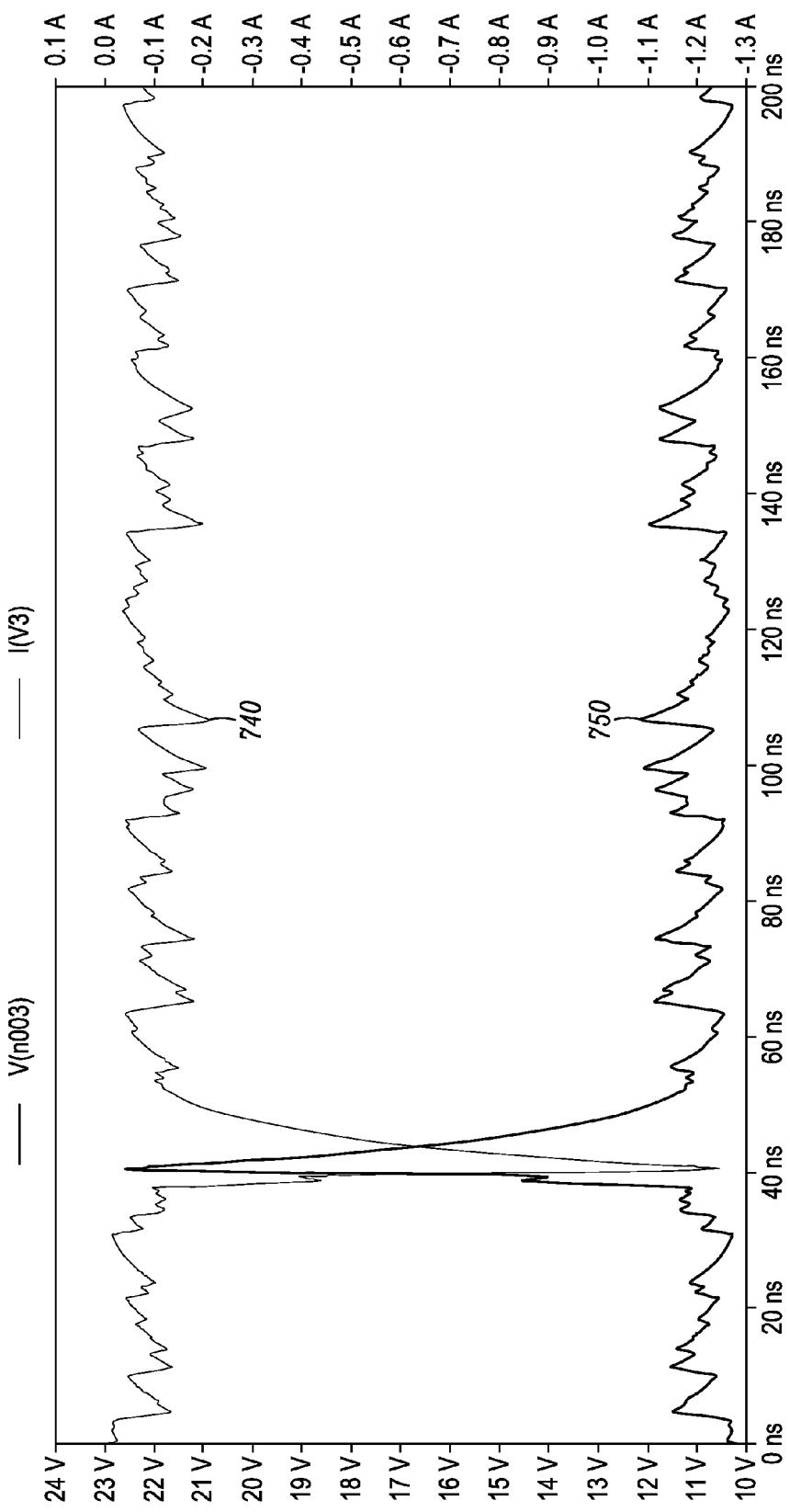
FIG. 16 illustrates an exemplary power supply that delivers a fixed current.
Figure 17:
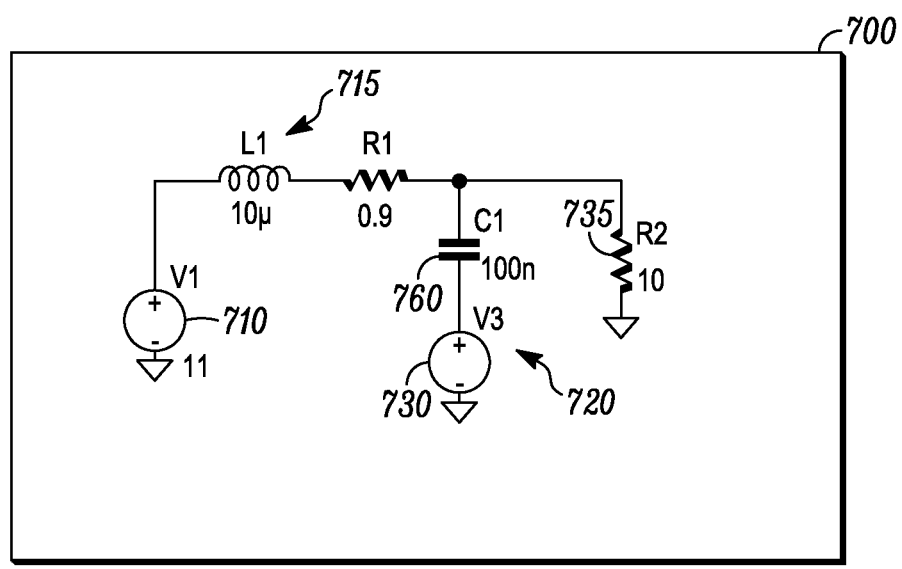
FIG. 17 illustrates an exemplary embodiment that replaces a power supply with a capacitor.

In some embodiments where the power supply is modulated, the combination of bias current and voltage supply modulation can yield further power savings, for instance by a factor of four instead of a factor of two as was shown with bias modulation only. However, the construction of a modulated voltage supply is more complex than modulating the bias current of the transistors. FIGS. 15-17 show embodiments for a power supply with energy stored in an inductor that supports power delivery during normal operation and during voltage transients FIG. 15, for example, shows a power supply 700 with the main power supply 710 set to 11V, for example. The power supply 700 may provide current through inductor 715 with a parasitic internal resistance R1 (e.g., a 10 mOhm to 1 Ohm resistor, 900 mOhm in this example). A variable voltage source 720 comprising a series connection of first fixed voltage source 725 and a second variable voltage source 730 is shown connected in parallel with the load 735. The variable voltage of the voltage supply 730 is made to be proportional to a bias control signal.

As shown in FIG. 16, in a bias voltage control transient, the voltage across load R2 peaks from around 10V to around 22 V, as seen in curve 740. The current from power supply 710, seen as curve 745, is fixed at about −1 A. The current from power supply 720, seen in curve 750 peaks to about −1.2 A during the transient, but otherwise it is small (−0.1 A or less). Except for the transient, nearly all the power is delivered by power source 710. Power source 720 has enough headroom to provide twice the supply voltage but only delivers power during the transient and while it is delivering power the power source 710 continues to deliver power due to the inductance of the inductor 715 that holds the current constant during the transient. As a result the average power delivered by power source 710 (1 A) is much larger than the average current from source 720 (0.12 A). Since power source 725 needs to be able to reach 22V it is generally implemented with a 22 V source and a transistor stage following that to create the transient waveform. Thus we can estimate power dissipation in the voltage source 710 can be estimated at 11 W (11V×1 A) and the power dissipation in voltage source 720 estimated at 2.64 W (22V×0.12 A). The total, 13.64 W is much lower than the 25.64 W (22V×1.12 A) that would be the case if a fixed 22V power supply was used for the full current.

As shown in FIG. 17, some embodiments may replace the voltage supply 725 by a capacitor 760. In this example, the capacitor 760 may self-charge to around 10V so that an external 22V supply is no longer needed. The capacitor 760 is large enough to retain the 10V difference during the surge and the voltage supply 720 can be driven from a 12 V supply; no other higher voltage supply is needed.

In some embodiments, the presence of inductor 715 is essential to keep the current through the transient voltage generator 730 low as the inductor 715 supports the average current during normal operation where the output voltage is close to the main power supply, the main power supply provides all the power, and the inductor 715 sustains that current during transients where the voltage could be much higher (for instance doubled) so that the transient voltage generator only needs to generate the additional current needed excluding the average current that was already provided by L1.

Embodiments are described for node power reduction enabled by nodes with amplifiers driven by DA converters. In node amplifier embodiments, the bias point of the amplifier may be modulated such that the amplifier dissipation is significantly reduced. In some embodiments, the node creates a pilot tone at a frequency adjacent to a signal band of the CATV plant. The amplitude and/or phase of the pilot tone can be modulated in accordance with the desired bias point to operate the amplifiers in the CATV plant. While the node amplifier can be controlled directly by DA converters, other amplifiers downstream receive the pilot tone, demodulate it, and use the demodulated tone to control the bias point of the downstream amplifiers. The pilot tone is passed to subsequent amplifiers by selecting it to be within the gain band of the amplifiers. Thus, the node can control the bias point of a chain of subsequent amplifiers without the need for full signal DA conversion in each of the amplifiers. As disclosed, in embodiments, all amplifiers in the amplifier chain can benefit from a reduction in power dissipation.

Figure 18:
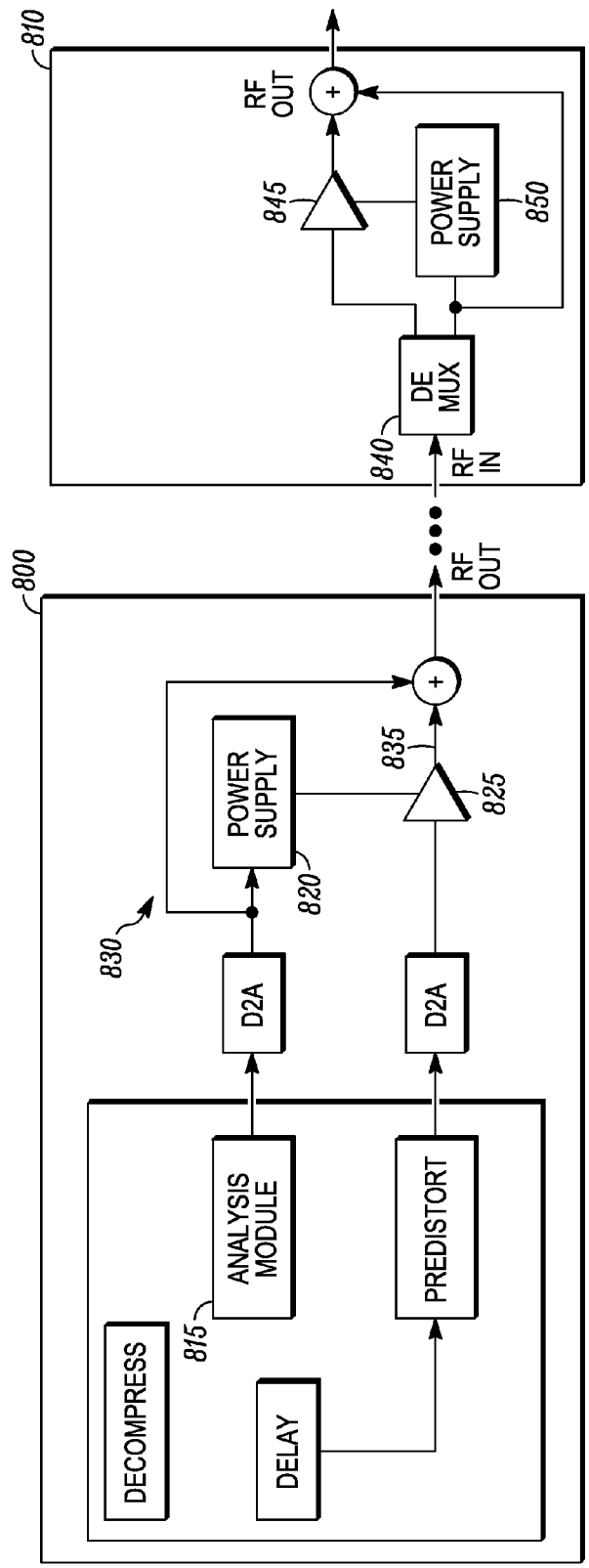
FIG. 18 illustrates an exemplary circuit capable of passing a pilot tone from one amplifier to another amplifier.

FIG. 18 shows one exemplary system by which a first node 800 analyzes a signal envelope in a module 815 to determine a bias control signal 830 to a power supply 820, so as to lower the power dissipation of the amplifier 825 when amplifying a delayed driving signal, in accordance with the systems and methods described earlier. The bias control signal 830, i.e. a pilot tone modulated by the bias control signal may then be added to the output 835 of the amplifier 825 so that the combined RF signal may be transmitted to a downstream node 810 or other amplifier system. Preferably, the pilot tone 830 occupies a different frequency band than that of the CATV output signal 835, so that the downstream node 810 may demultiplex or demodulate 840 the combined signal to separately drive the amplifier 845 and the power supply 850 in the downstream node 810. It should be noted that, because the node 800 has already introduced a delay between the bias control signal and the amplifier signal, the downstream node 810 needs no further synchronization.

Figure 19:
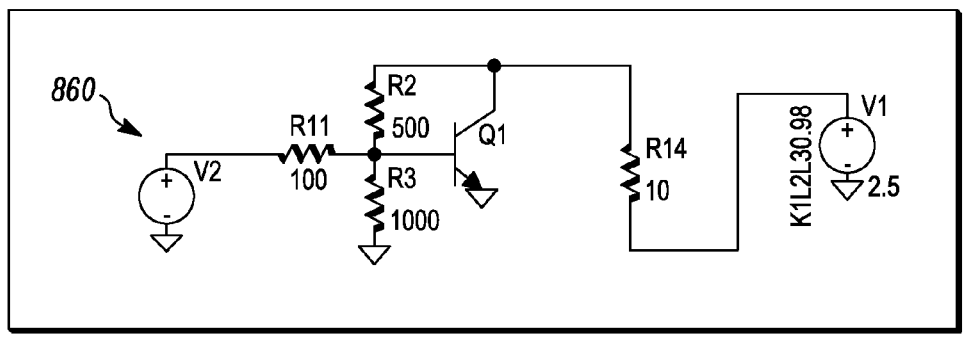
FIG. 19 illustrates an exemplary simplified circuit having a single ended stage.

As indicated earlier with respect to FIG. 6, for example, the bias control signal 830 needs to be added separately to the amplified driving signal 835 because the typical push-pull amplifier will self-cancel the bias control signal. FIG. 19, however, shows an alternate single-ended stage amplifier that does not self-cancel the bias control signal. In this single-ended stage amplifier 860, the current in the output resistor R14 contains both the bias control signal and the RF signal to amplify. Unlike in some embodiments with push-pull amplifier stages, the bias control signal is no longer self-cancelled. Preferably, an output filter is located in the path for generating the bias signal for a single ended stage, as shown in FIGS. 8 and 13 so as to position the bias control signal at a frequency band that does not interfere with the CATV driving signal for the amplifier, so that the lack of a self-cancelling bias control signal does not distort the amplified signal. In some embodiments, the bias signal may occupy a frequency band lower in frequency than the RF signal frequency band. In these embodiments, the bias signal need not interfere with the function of the RF amplifier. However, the bias signal will be present in the output of the amplifier, so that any downstream node or amplifier may receive the bias signal directly or as a modulated pilot tone generated by providing the bias signal to a modulator generating a pilot tone and adding that pilot tone to the amplifier output, receive it or demodulate it from the driving signal of the amplifier, and use the pilot tone to modulate a power supply without any need to analyze the signal envelope of the driving signal of the amplifier, yet still achieve a reduction in power dissipation of the amplifier. In some embodiments, an additional filter may be placed in the output of the last amplifier in the downstream path to remove unwanted spectrum resulting from bias modulation.

Figure 20:
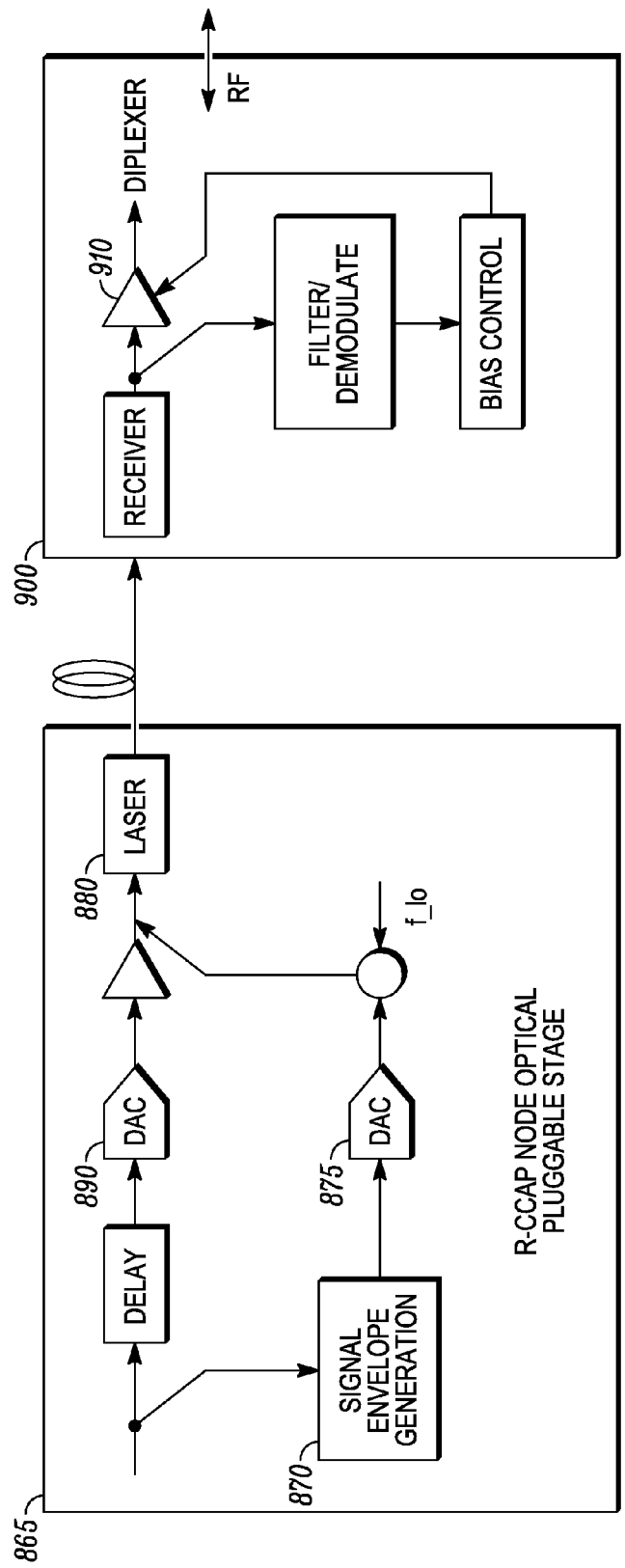
FIG. 20 illustrates an embodiment for use with the disclosed techniques for a node optical pluggable driver with signal envelope prediction for an amplifier in a node.

FIG. 20 illustrates another embodiment for use with the disclosed techniques for a node optical pluggable driver with signal envelope prediction for an amplifier in another node further along the downstream (or upstream) path. As a part of 'digital forward' effort, some significant signal envelope characteristics and peak to envelope characteristics of a binary sampled typical RF spectrum presented to an HFC system have been performed.

Any DAC driven RF chain can utilize digital signal processing to create a bias current and voltage envelope that permits amplification of high signal peaks while minimizing average power consumption. As disclosed herein, a tone may be modulated with a signal to control amplifier bias and sent on an RF link to subsequent amplifiers. As shown in FIG. 20, such a tone can also be sent via an analog optical link to another node to control the amplifier in that node and obtain a reduced power dissipation.

FIG. 20 depicts an R-CCAP node optical pluggable driver 865 with signal envelope prediction unit 870 for an amplifier 910 in the node 900. The signal envelope prediction signal is provided to a D2A converter 875 and up-converted to a carrier frequency f_lo and this signal is added into the signal that is transmitted to the node 900 by a laser 880. The laser 880 is driven by a delayed signal from a D2A converter 890. In some embodiments, the signal envelope prediction signal may be generated directly by the D2A converter 890 if that DAC has enough bandwidth to generate a signal modulated at frequency f_lo. The node 900 receives the modulated signal, demodulates that and uses it to dynamically control the bias of the output amplifier 910. Though FIG. 20 illustrates a remote CCAP (R-CCAP) located in a node along a signal path from a head end to one or more subscribers, the CCAP may alternatively be located in the head end, such that a pilot tone may be generated in the head end and transmitted along a signal path concurrently with a delayed signal so that all downstream amplifiers can use the pilot tone to modulate the bias point of the amplifier as the signal is being amplified.

Note that a signal modulated around f_lo or any other frequency can also be used to provide a communication path to the node 900. Such a communication path can be used to transmit other parameters as well such as pre-distortion settings (in case the node 900 has internal pre-distortion controls) or other information such as gain and wavelength settings to mitigate clipping or OBI on the return path.

In some embodiments the bias of an amplifier may modulated in a manner that reduces power consumption in accordance with the foregoing disclosure, but without modulating the power supply of an amplifier. Referring again to FIG. 2, for example, the bias of the amplifier is provided by V4, while V2 provides the signal to be amplified. Rather than changing the bias of the amplifier by modulating V4, the bias may instead be modulated by separately driving the signals to the respective transistors Q1 and Q2 such that the signal to Q1 is bias change is V4+V2/2 and the signal to Q2 is bias change V4−V2/2. Note that in such an embodiment the bias supply V4 may not be needed as the bias can simply be provided directly to the transistors.

Figure 21:
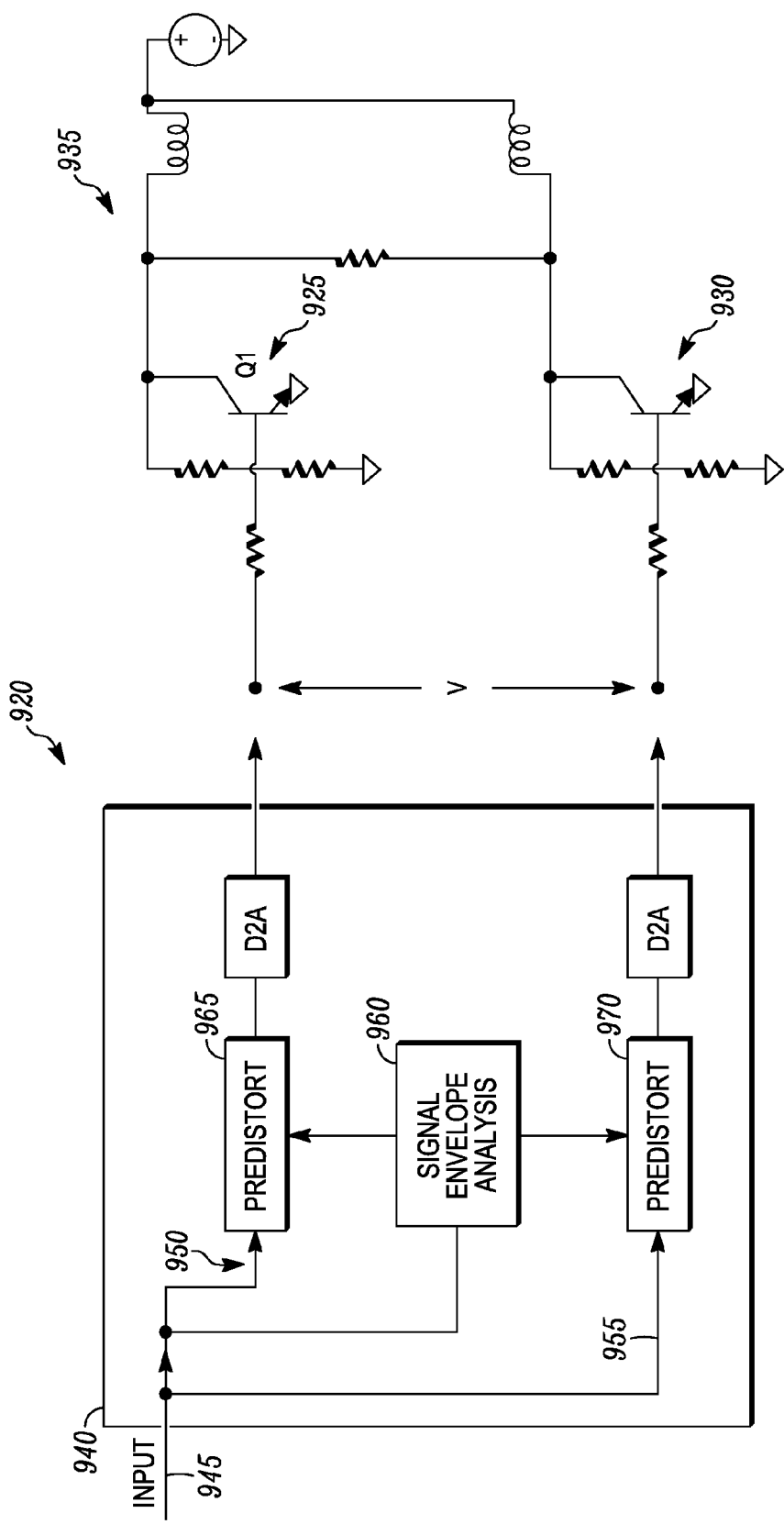
FIG. 21 shows an alternate system for modulating the bias of an amplifier.

FIG. 21 illustrates a system 920 that provides a modulated bias directly to the transistors 920 and 930 of amplifier 935. A processing unit 940 may receive an input signal 945 to be amplified and split the signal 945 into first component 950 and a second component 955 generally with opposite sign. A signal envelope analysis engine 960 analyzes the input signal 945 to identify large positive or negative peaks as described earlier, and based on that analysis modulates pre-distortion modules 965 and 970. If no signal peak is detected by the signal envelope analysis engine 960, the predistortion modules may apply a low bias to the amplifier 935 by adding a reference voltage to both signal components 950 and 755. Conversely, if the signal envelope analysis engine 960 detects a peak in the input signal, the predistortion modules may increase the voltage applied by the respective predistortion modules 965 and 970 to the signal components 950 and 955 such that neither the sum of voltage added and signal components 950 nor the sum of voltage added and signal component 955 becomes so low that transistor 925 or transistor 930 could be turned off completely. In this manner, the system 920 can modulate the bias of the amplifier 935 independently of a power supply of the amplifier 935 so as to reduce the amplifier's power consumption. As discussed earlier, the predistortion modules 965 and 970 may add further predistortion components based on input signals 950, 955, 965 and 970 to reduce distortions cause by transistor non-linearities.

In one or more examples, the functions disclosed herein may be implemented in hardware, software, firmware, or any combination thereof. If implemented in software, the functions may be stored on or transmitted as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. "Disk" and "disc" as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses. Various components, modules, or units are described in this disclosure to emphasize functional aspects of components configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

The invention claimed is:

1. A system within a cable television (CATV) network, said system comprising:
   (a) a processor that receives a signal to be amplified by an amplifier at a location remote from said processor, and analyzes the signal to determine a pilot tone used to modulate a bias point of the remote said amplifier, where said processor includes a local amplifier having a power supply modulated by said pilot tone; and
   (b) a transmitter that transmits the pilot tone to the remote said amplifier along with said signal.

2. The system of claim 1 where the transmitter transmits said signal at a delayed time with respect to said pilot tone.

3. The system of claim 1 where the pilot tone is converted to a different portion of a frequency spectrum than the signal.

4. The system of claim 1 where said processor adds said pilot tone to a signal amplified by said local amplifier.

5. The system of claim 1 where said transmitter transmits pre-distortion information to said remote amplifier along with said signal and said pilot tone.

6. The system of claim 5 where the pre-distortion information is based on said signal and an envelope of said signal.

7. The system of claim 1, wherein the transmitter is at least one of an optical transmitter that transmits over fiber or a radio frequency amplifier that transmits over a coaxial connection.

8. A method comprising:
   (a) receiving a signal to be amplified by at least one remote amplifier;
   (b) analyzing said signal to generate a pilot tone used to modulate a bias point of the at least one remote amplifier;
   (c) modulating a power supply of a local amplifier having a power supply by said pilot tone;
   (d) transmitting said signal and said pilot tone to said at least one remote amplifier; and
   (e) using the pilot tone to modulate a bias point of said at least one remote amplifier as said signal is being amplified by said at least one remote amplifier.

9. The method of claim 8 where said signal is transmitted to said remote amplifier at a delay relative to said pilot tone.

10. The method of claim 8 where said signal and said pilot tone are transmitted to said remote amplifier at different frequency bands along a common transmission medium.

11. The method of claim 8 where said pilot tone is used by said amplifier to reduce the power usage of said amplifier.

12. The method of claim 8 where said pilot tone is present in an output signal obtained from said at least one remote amplifier.

13. A non-transitory computer-readable medium comprising instructions for executing by a processing unit, the computer-readable medium including instructions for:
   receiving a signal output from a digital to analog converter (DAC) to be amplified by an amplifier remote from said DAC,
   analyzing the signal to determine a pilot tone used to modulate a bias point of the remote amplifier along with said signal, said pilot tone also modulating a power supply of an amplifier local to said DAC,
   wherein the signal to the remote amplifier includes a component to be amplified by the remote amplifier, and the pilot tone modulates the bias point of the remote amplifier, where the pilot tone is based on the component of the signal.

14. The non-transitory computer-readable medium of claim 13, further comprising instructions for transmitting the signal at a delayed time with respect to said pilot tone.

15. The non-transitory computer-readable medium of claim 13 further comprising instructions for converting the pilot tone to a different portion of a frequency spectrum than the signal.

16. The non-transitory computer-readable medium of claim 13 further comprising instructions for adding the pilot tone to a signal amplified by said local amplifier.

17. The non-transitory computer-readable medium of claim 13 wherein a third component of the signal is capable of pre-distorting the first component prior to amplification.

18. The non-transitory computer-readable medium of claim 13 further comprising instructions for transmitting pre-distortion information to said remote amplifier along with said signal and said pilot tone.

19. A system within a CATV network, said system comprising:
   (a) a processor that receives a signal to be amplified by an amplifier at a location remote from said processor, and analyzes the signal to determine a pilot tone used to modulate a bias point of the remote said amplifier; and
   (b) a transmitter that transmits the pilot tone to the remote said amplifier along with said signal, where said transmitter transmits pre-distortion information to said remote amplifier along with said signal and said pilot tone.

20. The system of claim 19 where the transmitter transmits said signal at a delayed time with respect to said pilot tone.

21. The system of claim 19 where the pilot tone is converted to a different portion of a frequency spectrum than the signal.

22. The system of claim 19 including where said processor includes a local amplifier having a power supply modulated by said pilot tone.

23. The system of claim 22 where said processor adds said pilot tone to a signal amplified by said local amplifier.

24. The system of claim 19 where the pre-distortion information is based on said signal and an envelope of said signal.

25. The system of claim 19, wherein the transmitter is at least one of an optical transmitter that transmits over fiber or a radio frequency amplifier that transmits over a coaxial connection.

26. A method comprising:
   (a) receiving a signal to be amplified by at least one remote amplifier;
   (b) analyzing said signal to generate a pilot tone used to modulate a bias point of the at least one remote amplifier;
   (c) transmitting said signal and said pilot tone to said at least one remote amplifier;
   (d) using the pilot tone to modulate a bias point of said at least one remote amplifier as said signal is being amplified; and
   (e) transmitting pre-distortion information to said remote amplifier along with said signal and said pilot tone.

* * * * *